US006545891B1

(12) United States Patent
Tringali et al.

(10) Patent No.: US 6,545,891 B1
(45) Date of Patent: Apr. 8, 2003

(54) MODULAR MEMORY DEVICE

(75) Inventors: J. James Tringali, Los Altos, CA (US); P. Michael Farmwald, Portola Valley, CA (US); Thomas H. Lee, Cupertino, CA (US); Mark G. Johnson, Los Altos, CA (US); Derek J. Bosch, Mountain View, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 18 days.

(21) Appl. No.: 09/638,334

(22) Filed: Aug. 14, 2000

(51) Int. Cl.⁷ .................................................. G11C 5/02

(52) U.S. Cl. .............................. 365/51; 365/52; 365/63

(58) Field of Search ............................ 365/51, 52, 63, 365/130, 185.04, 104, 94; 361/735, 803

(56) References Cited

U.S. PATENT DOCUMENTS

| 4,272,880 A | | 6/1981 | Pashley |
| 4,442,507 A | | 4/1984 | Roesner |
| 4,489,478 A | | 12/1984 | Sakurai |
| 4,498,226 A | | 2/1985 | Inoue et al. |
| 4,499,557 A | | 2/1985 | Holmberg et al. |
| 4,646,266 A | | 2/1987 | Ovshinsky et al. |
| 4,677,742 A | | 7/1987 | Johnson |
| 5,070,384 A | | 12/1991 | McCollum et al. |
| 5,283,759 A | * | 2/1994 | Smith ........................ 365/104 |
| 5,306,935 A | | 4/1994 | Esquivel et al. |
| 5,427,979 A | | 6/1995 | Chang |
| 5,441,907 A | | 8/1995 | Sung et al. |
| 5,535,156 A | | 7/1996 | Levy et al. |
| 5,553,019 A | * | 9/1996 | Sandvos et al. ....... 365/185.04 |
| 5,561,628 A | * | 10/1996 | Terada et al. .......... 365/185.04 |
| 5,568,361 A | * | 10/1996 | Ward et al. .................. 361/735 |
| 5,602,987 A | | 2/1997 | Harari et al. |
| 5,640,343 A | | 6/1997 | Gallagher et al. |
| 5,699,317 A | | 12/1997 | Sartore et al. |
| 5,721,862 A | | 2/1998 | Sartore et al. |
| 5,745,407 A | | 4/1998 | Levy et al. |
| 5,818,748 A | | 10/1998 | Bertin et al. |
| 5,835,396 A | * | 11/1998 | Zhang .......................... 365/51 |
| 5,856,221 A | | 1/1999 | Clementi et al. |
| 5,877,975 A | * | 3/1999 | Jigour et al. ................... 365/52 |
| 5,889,694 A | | 3/1999 | Shepard |
| 5,911,104 A | | 6/1999 | Smayling et al. |
| 5,943,254 A | * | 8/1999 | Bakeman et al. .............. 365/72 |
| 5,991,194 A | | 11/1999 | Jigour et al. |

(List continued on next page.)

FOREIGN PATENT DOCUMENTS

WO    WO 99/14763    3/1999

OTHER PUBLICATIONS

Douglas, John H., "The Route To 3–D Chips", High Technology, Sep. 1983, vol. 3, No. 9, pp. 55–59.
Edited by Cappelletti, Paulo et al., "Flash Memories", Kluwer Academic Publishers, 1999.
Kawashima, Shoichiro et al., "A Charge–Transfer Amplifier and an Encoded–Bus Architecture for Low–Power SRAM's", IEE Journal of Solid–State Circuits, vol. 33, No. 5, May 1998, pp. 793–799.

(List continued on next page.)

Primary Examiner—David Lam
(74) Attorney, Agent, or Firm—Brinks Hofer Gilson & Lione

(57) ABSTRACT

A modular memory device includes a support element, a memory unit comprising a three-dimensional memory array carried by the support element, a device interface unit carried by the support element and coupled with the memory unit, and an electrical connector carried by the support element and coupled with the device interface unit. The memory array is well suited for use as a digital medium storage device for digital media such as digital text, digital music, digital image or images, and digital video. The device interface unit is not required in all cases.

31 Claims, 4 Drawing Sheets

U.S. PATENT DOCUMENTS

| | | | |
|---|---|---|---|
| 6,034,882 A | * | 3/2000 | Johnson et al. ............. 365/103 |
| 6,124,157 A | | 9/2000 | Rahim |
| 6,160,718 A | * | 12/2000 | Vakilian ..................... 257/686 |
| 6,207,991 B1 | | 3/2001 | Rahim |
| 6,263,398 B1 | | 7/2001 | Taylor et al. |
| 6,266,272 B1 | | 7/2001 | Kirihata et al. |

OTHER PUBLICATIONS

Zhang, Ph.D., Guobiao, "*Three–Dimensional Read–Only Memory (3D–ROM)*", presentation from website zhangpatents, pp. 1–29.

Zhang, Ph.D., Guobiao, "*3D–ROM—A First Practical Step Towards 3D–IC*" Semiconductor International, Jul. 2000, from website zhangpatents, pp. 1–7.

"A 10ns Read and Write Non–Volatile Memory Array Using a Magnetic Tunnel Junction and FET Switch in each Cell," Scheuerlein et al., ISSCC 2000/Session 7/TD: Emerging Memory & Device Technologies/Paper TA 7.2, 4 pages, Feb. 8, 2000.

"MultiMediaCard System Specification Version 2.2 Official Release," pp. 10, 12, and 14, Jan. 2000.

* cited by examiner

MODULAR MEMORY DEVICE

BACKGROUND

The present invention relates to modular memory devices and that include non-volatile, solid-state memory arrays.

A variety of portable consumer products capture and store digital data in a non-volatile manner. Digital cameras and digital audio players are two examples of such products. The memory devices for this class of products are preferably modular devices that are small enough to be hand-held and easily transported by a user. Ideally, these storage devices should be removable and lightweight, and they should provide a multi-megabyte storage capacity and achieve a low actual sales price (ASP).

One prior-art approach to such memory devices is known as the flash memory card. Such cards fit into the palm of a user's hand, are lightweight, and provide storage capabilities that are matched to the needs of the portable device segment of the consumer market. However, flash memory cards do not adequately address the cost requirements of this market segment. The cost per megabyte as of June 2000 for flash memory cards, such as CompactFlash cards, is between $2–4 at the forty megabyte level (ASP). Since most consumer applications in the portable device segment of the market require at least forty megabytes of non-volatile storage, flash memory cards represent a significant portion of the cost of the overall device.

Other memory cards built to address this market segment include the Multi-Media Card (MMC), that has a cost per megabyte as of June 2000 of between $3–5 (ASP). All of these memory cards use conventional two-dimensional memory arrays.

BRIEF SUMMARY

The preferred embodiments described below satisfy the size, weight, storage and cost requirements of consumer applications requiring non-volatile digital storage. These embodiments include a memory array and a memory array controller carried by a support element, and an electrical connector carried by the support element and coupled with the memory array controller. The memory array is preferably, though not necessarily, a write-once, three-dimensional, field-programmable memory array. Such memory arrays provide the advantage of substantially reduced cost per bit. When a device interface unit is used, it is preferably highly integrated to minimize cost. By reducing cost of both the memory unit and the device interface unit, the overall price of the modular memory device is substantially reduced as compared with the prior art described above.

This section has been provided by way of general introduction, and it is not intended to limit the scope of the following claims.

DETAILED DESCRIPTION OF THE PRESENTLY PREFERRED EMBODIMENTS

Figure 1:
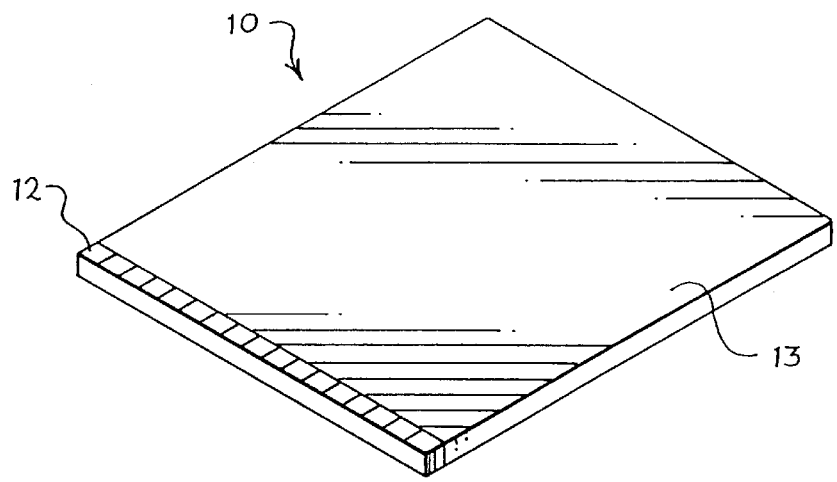
FIG. 1 is a perspective view of a modular memory device that incorporates a preferred embodiment of this invention.

Turning now to the drawings, FIG. 1 shows an overall view of a modular memory device 10 that includes an electrical connector 12 at one end. The exterior surfaces of the memory device 10 are enclosed within a housing 13 as shown. The housing 13 protects the internal components of the device 10 and forms a compact, modular, handheld unit that is easily transported and easily inserted into and removed from a read/write device such as a camera or an electronic book by a consumer. The connector 12 can take any suitable form, and in this example is arranged as a series of conductive pads spaced and arranged to mate with corresponding contacts of a mating connector (not shown). Of course, any suitable connector 12 can be used, and this invention is not limited to the edge connector shown in FIG. 1.

Figure 2:
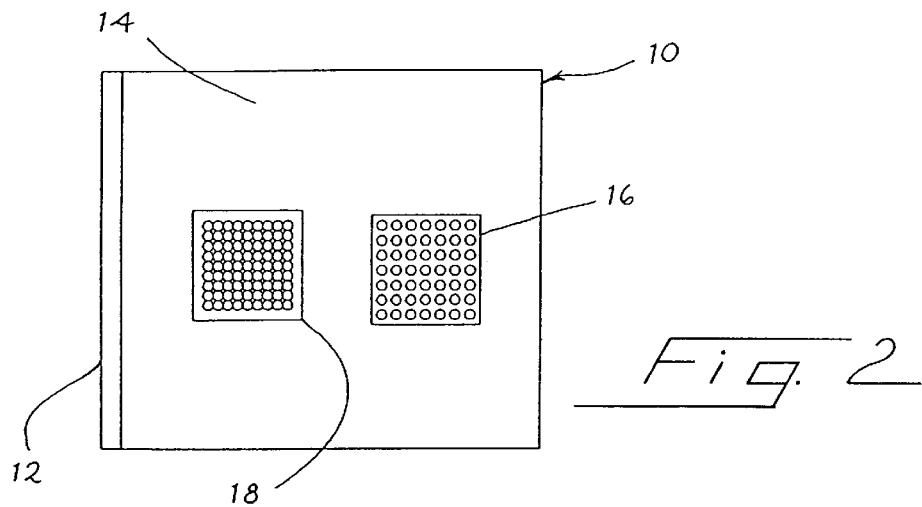
FIG. 2 is a cross-sectional view of the memory device of FIG. 1.

FIG. 2 is a cross-sectional view through the device 10 of FIG. 1. As shown in FIG. 2, the device 10 includes a support element that in this embodiment takes the form of a printed circuit board 14. The printed circuit board 14 may form one of the exterior surfaces of the device 10. The printed circuit board 14 carries a memory unit 16, a device interface unit 18, and the electrical connector 12.

The memory unit 16 preferably includes a three-dimensional memory array and an associated memory array controller. The preferred memory array includes a suitable number of memory cells arranged in a three-dimensional lattice above a substrate. The three-dimensional memories described in Johnson U.S. Pat. No. 6,034,882, Knall U.S. patent application Ser. No. 09/560,626, and Johnson U.S. patent application Ser. No. 09/638,428 can be used for the memory array. All of these patent documents, which are assigned to the assignee of the present invention, are hereby incorporated by reference. The memory array controller is preferably formed on the same substrate over which the memory array is built, and the memory array controller includes address decoding circuitry, sensing circuitry for read operations, drive circuitry for write operations, and I/O interface circuitry including I/O amplifiers.

The device interface unit 18 in this embodiment is fabricated on a separate substrate and is electrically connected to the memory unit 16 and to the electrical connector 12 via the printed circuit board 14. In this embodiment, both the memory unit 16 and the device interface unit 18 are directly mounted to the printed circuit board. The device interface unit 18 includes all of the components needed to create the voltages, clock frequencies, and protocol logic that allow the memory device 10 to attach to a variety of consumer devices, all integrated into a single piece of silicon substrate. In one implementation, the device interface unit 18 comprises circuitry (using any suitable combination of hardware, software, and firmware) to implement the task file, interrupt management, error reporting and configuration functions included in the protocol being used (e.g., a protocol such as the CompactFlash protocol).

Figure 3:
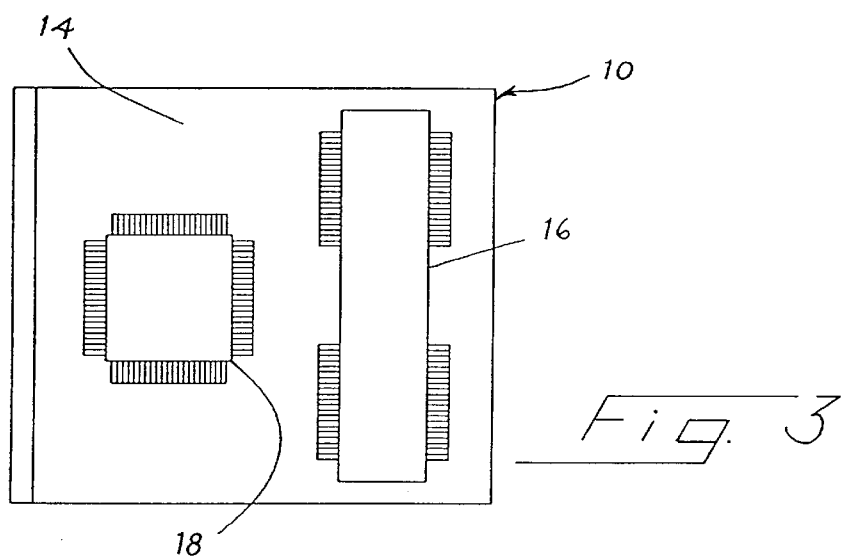
FIGS. 3 and 4 are cross-sectional views of alternative embodiments of the memory device of FIG. 1.

FIG. 3 shows a modified form of the embodiment of FIG. 2. In the embodiment of FIG. 3 the device interface unit 18 and the memory unit 16 are packaged in conventional intermediate chip packages such as those known in the art as TSOP or TQFP packages. These packaged elements are then assembled onto the printed circuit board 14 in the conventional manner.

Figure 4:
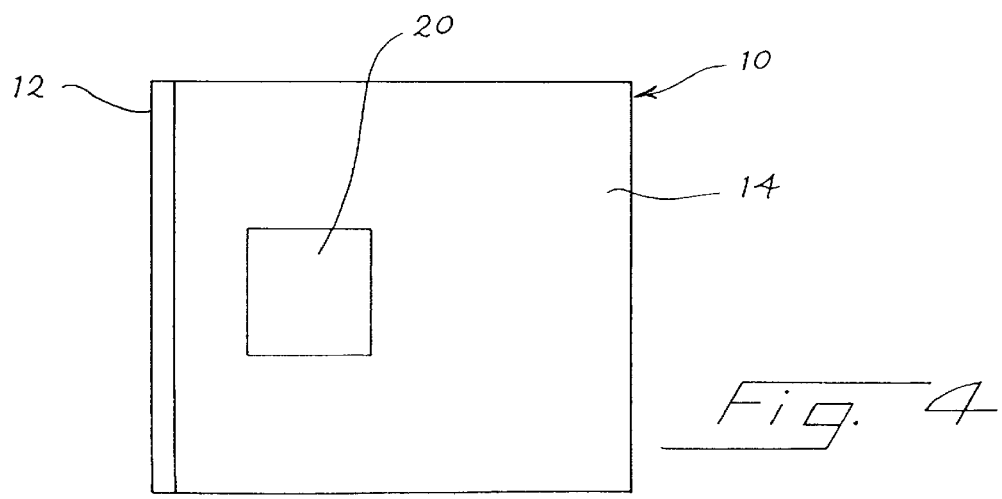

In the embodiment of FIG. 4, the three-dimensional memory array, the memory array controller and the device interface unit are fabricated on a single substrate 20, which is preferably directly mounted to the printed circuit board 14, without an intermediate package. The memory array controller and the device interface unit can be fabricated on a silicon substrate, under the three-dimensional memory array. This arrangement minimizes fabrication cost of the memory device. In this case, the memory array controller may not require I/O amplifiers as described above.

The embodiment of FIG. 4 is well-suited for applications such as those using the CompactFlash protocol. This embodiment can be implemented with either a two- or three-dimensional memory array of non-volatile memory cells.

In order to build a minimal-cost controller, the total number of signals required for interfacing the memory unit 16 to the desired memory card standard is determined. The number of power and ground connections required to keep the power system inside of the silicon chip stable enough to guarantee flawless operation under all operating conditions is then added to this list. This pin count information determines the smallest rectangle that accommodates the number of required connections. The dimensions of the rectangle are a function of one fourth the number of pins and the height and width of the pin driver circuitry. The following equations describe the resultant edge length:

$$length = \left(\frac{number\_of\_pins}{4}\right) \times driver\_width + 2 \times driver\_height$$

$$die\_area = length^2.$$

Once the length equation is minimized, the required die_area is set. The area usable for creating the required logic functions and any required power or clocking circuitry needed to connect the memory unit 16 to the chosen system bus standard can then be determined by the following equation:

$$usable\_area = \left(\left(\frac{number\_of\_pins}{4}\right) \times driver\_width\right)^2.$$

A silicon process technology is then chosen that gives an appropriate logic density such that the number of required components divided by the component density equals the usable_area calculation from the previous equation.

In the embodiments described above, memory cells are organized and built in three dimensions rather than two. There are several layers of memory cells, and the layers are vertically stacked above one another. The three dimensions are called "rows", "columns", and "layers". Typically, the rows and columns are generally parallel to the upper surface of an underlying substrate, and the layers are separated from one another along a direction perpendicular to the upper surface of the underlying substrate.

Some memory cells contain an element that protrudes either upwardly or downwardly, and have in the past been referred to as a "three dimensional memory cell". However these memory cells are arrayed in a conventional two-dimensional array. This is quite different from the three-dimensional embodiments described herein, which include a three-dimensional array of memory cells, with several layers of memory cells stacked vertically above one another.

A significant feature of these embodiments is that they explicitly decrease memory operating speed, in exchange for low cost, three-dimensional organization. These embodiments use very small switching devices, giving a small memory cell and a small total chip area. The small switching devices also give a small read current, which makes the read access time relatively slow.

However, there are several important memory applications which can easily tolerate a slow access time, and which derive tremendous benefit from dramatically lower memory cost. Many of these low-speed applications may be collected together under the name "digital media storage" and include the following: digital storage of still images such as photographs, digital storage of music and digital audio in general, digital books, digital storage of maps, sequences of images including digital video, and numerous other examples which will be readily apparent to those skilled in the art. Digital media storage applications can be considered as storage applications by means of which copyrightable material may be fixed in a tangible medium of expression. For such applications, re-writability of the storage medium may not be an asset, and in fact may even be undesirable. For example, it may be important to have an unambiguous and immutable record of the expressed material. Moreover, cost is generally lower for write-once than for rewritable memory devices.

Figure 7:
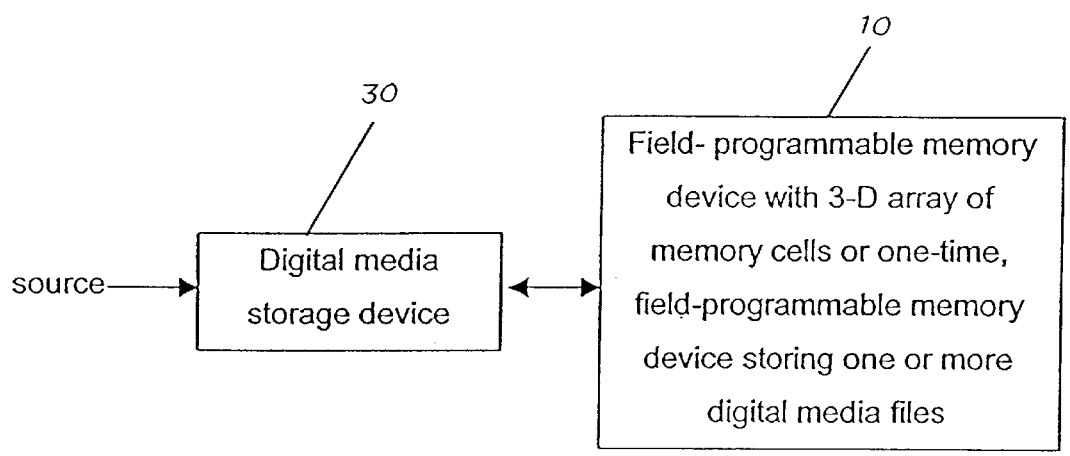
FIG. 7 is a block diagram of a modular memory device connected to a digital media storage system.

FIG. 7 shows in block diagram form the memory device 10 described above in combination with a digital media storage device 30. The memory device 10 can take any of the forms described herein, and it preferably includes a 3-D array of write-once, field-programmable memory cells. As explained above, such a device provides the advantage of unusually low cost. The memory device 10 is formed as a modular, hand-held unit with an external connector as described above to allow a user to readily connect the memory device 10 to the digital media storage device 30 and to remove it. Further details regarding the structure of the memory device 10 are described in U.S. patent applications Ser. Nos. 09/638,439 and 09/638,427, both filed on the same date as the present application, assigned to the assignee of the present invention, and hereby incorporated by reference in their entirety. In alternative embodiments, a multi-write 3-D array may be used, such as that described in the U.S. patent application Ser. Nos. 09/639,702 and 09/639,577, both filed on the same date of this present application and assigned to the assignee of this invention.

The digital media storage device 30 can take any suitable form, and may for example be a digital camera, a digital audio playback device, or an electronic book. The storage device 30 performs two separate functions. First, the storage device 30 presents to the user the digital media stored in the memory device 10, as for example by showing still or moving images, playing audio files, or displaying the pages of an electronic book. Second, the storage device 30 can be used to field program the memory device 10 with the desired digital media information. For this purpose, the digital media storage device 30 is connected to a source, and field programs digital media information from the source to the memory device 10. The digital media source can take any suitable form, and will often include another computer (not shown). For example, the source may provide digital media information to the storage device 30 via a network such as the Internet or via a system provided in a store such as a record store or a book store for downloading digital media into the memory device 10 provided by a consumer. The source of digital data may also include but is not limited to the output of a charge coupled device array (CCD) as in a digital camera or the output of a coder-decoder (CODEC) as in a music player-recorder. In some applications, the source may store the digital media information in the memory device 10 directly, rather than by way of the digital media storage device 30, and this is another example of field programmability. In general, the term "field programmable" is intended broadly to encompass writing into the memory device a file selected or chosen by a user at a time after fabrication of the memory device has been completed.

The memory array of the embodiments described herein includes a vertical stack of multiple layers of memory cells, and the memory cell may take any desired form; memory cells taught in Zhang U.S. Pat. No. 5,835,396, Johnson U.S. Pat. No. 6,034,882, and Knall U.S. patent application Ser. No. 09/560,626 may be taken as examples. However the preferred embodiments described herein have been designed to minimize cost, and the memory cells are therefore as small as possible.

To make the memory cells small, fine-pitch photolithography is used to pattern the geometric shapes of the memory cells. In particular, the wordlines and bitlines are preferably formed with a linewidth no larger than approximately 1 micron, and a line-to-line spacing no larger than about 1 micron. These values of F (the photolithographic featuresize) may be further reduced; it is more preferable that the linewidth and spacing be smaller than approximately 0.25 microns.

Figure 5:
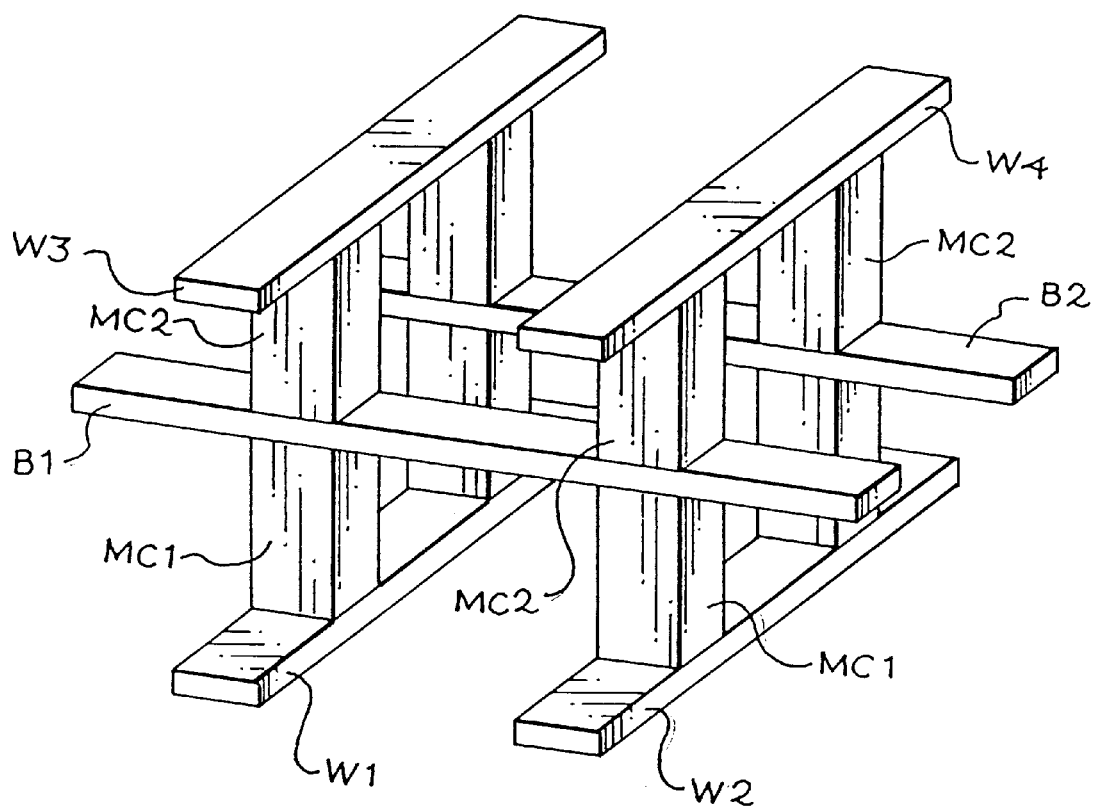
FIG. 5 is a schematic view of a portion of a three-dimensional memory array.

FIG. 5 shows a schematic representation of one embodiment of a memory array of the type described above. Each of the memory cells MC1, MC2 is a two-terminal cell that includes a state storage element. In this embodiment, the memory cells MC1 are arranged at a first level, and the memory cells MC2 are arranged at a second level that is vertically stacked with respect to the first level. The terminals of the memory cells MC1, MC2 are disposed at the respective ends of the cell. In this connection, the term "terminal" is intended broadly, and a terminal may be embodied simply as a terminal portion of the cell, or as a separate layer of the cell.

Each of the terminals of each of the memory cells MC1, MC2 is in electrical contact with a respective conductor or wire. The conductors W1, W2 at the bottom of the memory cells MC1 in the view of FIG. 1 are configured as wordlines, and the conductors B1, B2 connected to the upper terminals of the memory cells MC1 are configured as bitlines, which in this embodiment run substantially perpendicularly to the wordlines W1, W2. Thus, each of the memory cells MC1 bridges a selected one of the wordlines W1, W2 and a selected one of the bitlines B1, B2.

Similarly, the memory cells MC2 of the second layer are connected between selected ones of the bitlines B1, B2 and selected wordlines W3, W4. The wordlines W3, W4 in this embodiment are disposed on another level, vertically stacked above the level of the bitlines B1, B2.

The memory cell array of FIG. 5 can be similar in basic geometry and materials to that described in FIGS. 6a through 6g of the above-identified Johnson patent.

For embodiments in which the basic cell size in plan view is 2F by 2F (such as taught by the above-identified Johnson and Knall patent documents), the pitch of the memory cell (the total width of 100 adjacent cells, divided by 100) is preferably no larger than about 0.50 microns (and generally no larger than 2 microns) in either the wordline or bitline direction, and the total area consumed by a memory cell is preferably no larger than approximately 0.25 square microns. The chip area consumed is then approximately $\leq 0.25$ square millimeters per million bits on each layer of the vertical stack. Stating the same result another way, the packing density is $\geq 4$ million bits per square millimeter on each layer of the vertical stack.

Vertical stacking increases density and decreases chip area for a given size of a memory array; in a preferred embodiment having eight layers of memory cells vertically stacked above one another, the density is $\geq 32$ million bits per square millimeter of chip area.

As fine-pitch lithography improves, the density of these memory cells improves as well. The following equation shows the packing density in bits per unit area, for a lithography generation whose featuresize is F and for a vertical stack of N layers of 2F by 2F cells:

packing density=$N/(4F^2)$.

It should be noted that other, less densely packed, embodiments of the present invention can use memory cells that are larger than $4F^2$ (see, e.g. the memory cell shown in FIG. 6B of the above-identified Zhang patent). These larger memory cells result in a larger chip area and are thus less desirable.

Figure 6:
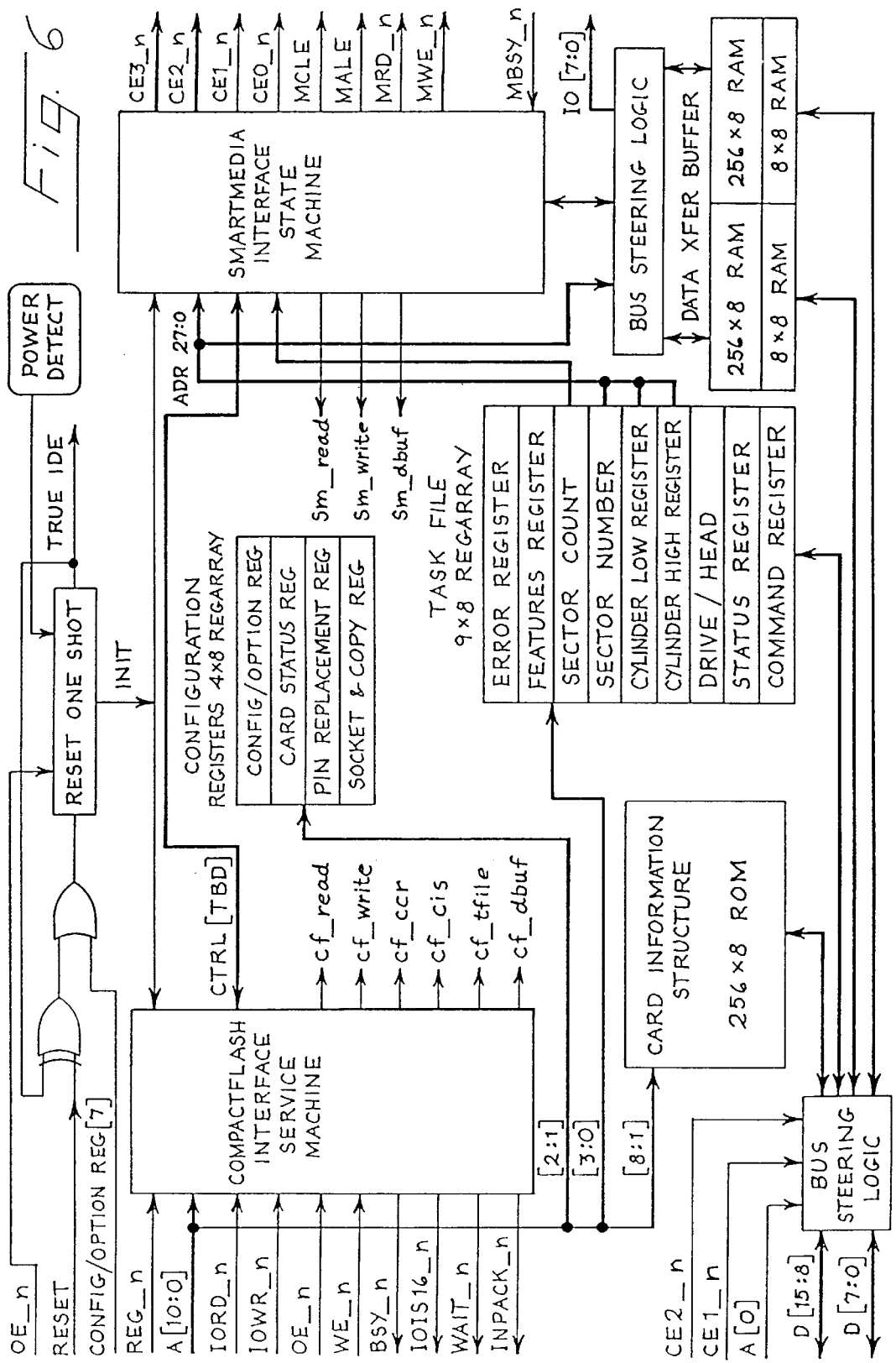
FIG. 6 is a schematic diagram of a preferred embodiment of the device interface unit 18 of FIG. 2.

A preferred embodiment for the device interface unit 18 is described in block diagram form in FIG. 6. In this example, the CompactFlash Interface State Machine implements the task file, interrupt management, error reporting and configuration functions for the CompactFlash protocol, and the SmartMedia Interface State Machine implements these functions for the SmartMedia protocol. Both of these protocols are readily available to those skilled in the art. The device interface unit of FIG. 6 can be fabricated on a silicon die measuring 2.68 millimeters by 2.68 millimeters, providing a total substrate area of 7.18 square millimeters. In one embodiment the modular memory device 10 described above is used to store digital media, such as any of the digital media described above.

In another embodiment, the device interface unit 18 is deleted from the device 10, and the memory array controller of the memory unit 16 is coupled directly to the connector 12 by the printed circuit board 14. In this case, the memory unit 16 may be controlled by a device interface unit on the host system.

While the foregoing embodiments are directed to a 3-D memory array, another cost-reducing embodiment is directed to using a one-time programmable (OTP) array. For example, an electronically programmable read only memory (PROM) can be used. The cost differential between such an OTP memory and a conventional $E^2$PROM and Flash memory can be substantial.

For either the 3-D one-time programmable, the 3-D multi-write, or the 2-D OTP, any of a variety of housing materials and configurations can be used. Suitable materials include metal, epoxy, ceramic, and plastic. Configurations can include those that are compatible with any standard modules that have in the past been used with Flash memory or $E^2$PROM memory, or any future-developed standards. These include but are not limited to the CompactFlash, SmartMedia, MultiMediaCard, Secure Digital Music Initiative (SDMI), Sony MemoryStick and other standards. The configurations can include a separate or unintegrated device interface unit (i.e., the device interface unit can be integrated with the memory unit chip or not as a matter of design choice). The modules can be built around packaged dies, or each die can be mounted directly on a substrate that is in turn encapsulated within the housing. The substrate can be but is not limited to silicon, fiberglass or ceramic.

It should be apparent from the foregoing that an improved modular memory device has been described that can be fabricated at low cost, that is small and lightweight, and that provides the required capacity of non-volatile memory.

As used herein, the term "coupled with" is intended broadly to cover elements that are coupled directly as well as elements that are coupled indirectly. Thus, two elements that are coupled with one another may be coupled by means of an intervening, unnamed element.

The foregoing detailed description has described only a few of the many forms that this invention can take. For this reason, this detailed description is intended by way of illustration, and not by way of limitation. It is only the following claims, including all equivalents, that are intended to define the scope of this invention.

What is claimed is:

1. A modular memory device comprising:
  a support element;
  a memory unit comprising a three-dimensional memory array, said memory unit carried by the support element; and
  an electrical connector carried by the support element and coupled with the memory unit;
  wherein the three-dimensional memory array comprises a plurality of layers of memory cells stacked vertically above one another in a single chip.

2. A modular, digital medium memory device comprising:
  a support element;
  a memory unit comprising a memory array, said memory unit carried by the support element, said memory array comprising a plurality of write-once, field-programmable memory cells;
  a modular housing protecting the memory unit; and
  an electrical connector carried by the support element and coupled with the memory unit, said electrical connector exposed at an exterior surface of the memory device;
  said memory cells storing at least one digital media file selected from the group consisting of digital text, digital music, a digital image, a sequence of digital images, digital video, and combinations thereof.

3. The invention of claim 2 further comprising:
  a device interface unit carried by the support element and coupled with the memory unit and the electrical connector.

4. The invention of claim 3 wherein the memory unit and the device interface unit are fabricated on a single substrate, and wherein the substrate is carried by the support element.

5. The invention of claim 3 wherein the device interface unit fits within a substrate area of no more than 8 mm$^2$.

6. The invention of claim 2, 3, 4, or 5 wherein the memory cells are arrayed on a substrate with an area density no less than $3 \times 10^7$ memory cells per square millimeter of substrate.

7. The invention of claim 2, 3, 4, or 5 wherein the memory array stores at least one digital media file selected from the group consisting of digital text, digital music, a digital image, a sequence of digital images, and digital video, and combinations thereof.

8. A modular memory device comprising:
  a support element;
  a memory unit comprising a three-dimensional memory array, said memory unit carried by the support element; and
  an electrical connector carried by the support element and coupled with the memory unit;
  wherein the memory array comprises a plurality of write-once memory cells.

9. The invention of claim 8 wherein the memory array stores at least one digital media file selected from the group consisting of digital text, digital music, a digital image, a sequence of digital images, digital video, and combinations thereof.

10. A modular memory device comprising:
  a support element;
  a memory unit comprising a three-dimensional memory array, said memory unit carried by the support element; and
  an electrical connector carried by the support element and coupled with the memory unit;
  wherein the memory array comprises a plurality of memory cells arrayed on a substrate with an area density no less than $3 \times 10^7$ memory cells per square millimeter of substrate.

11. The invention of claim 10 wherein the memory array stores at least one digital media file selected from the group consisting of digital text, digital music, a digital image, a sequence of digital images, and digital video, and combinations thereof.

12. A digital media memory device comprising:
  a memory unit comprising a three-dimensional memory array comprising a plurality of stacked layers of memory cells;
  said memory cells characterized by respective digital states, said digital states storing a digital signal representing at least one digital media file selected from the group consisting of: a digital image, a sequence of digital images, a group of pages of digital text, digital music, a digital map, digital video, and combinations thereof.

13. The invention of claim 12 wherein the memory cells are write-once memory cells.

14. The invention of claim 12 or 13 wherein the memory cells are field programmable.

15. The invention of claim 12 wherein the memory cells are arrayed on a substrate with an area density no less than about $3 \times 10^7$ memory cells per square millimeter of substrate.

16. The invention of claim 12 further comprising:
  a support element that carries the memory unit;
  a device interface unit carried by the support element and coupled with the memory unit; and
  an electrical connector carried by the support element and coupled with the device interface unit.

17. The invention of claim 16 wherein the memory unit and the device interface unit are fabricated on a single substrate, and wherein the substrate is carried by the support element.

18. The invention of claim 16 wherein the device interface unit fits within an area of no more than 8 mm$^2$.

19. The invention of claim 2 or 12 in combination with a digital media storage device operative to field program said digital media file in said memory cells.

20. The invention of claim 19 wherein the storage device comprises a digital camera.

21. The invention of claim 19 wherein the storage device comprises a digital audio playback device.

22. The invention of claim 19 wherein the storage device comprises an electronic book.

23. The invention of claim 12, wherein the plurality of stacked layers are stacked vertically above one another in a single chip.

24. A modular memory device comprising:
  a support element;
  a memory unit comprising a write once memory array fabricated on a substrate, said memory unit carried by the support element;
  a device interface unit fabricated on the same substrate as the memory array and coupled with the memory unit; and an electrical connector carried by the support element and coupled with the device interface unit;

wherein the device interface unit comprises circuitry allowing the modular memory device to interface with a device coupled with the electrical connector.

25. The invention of claim 24 wherein the memory array comprises a three-dimensional array of memory cells.

26. The invention of claim 24 wherein the memory array comprises a two-dimensional array of memory cells.

27. A modular memory device comprising:

a support element;

a memory unit comprising a three-dimensional memory array fabricated on a substrate, said memory unit carried by the support element;

a device interface unit fabricated on the same substrate as the memory array and coupled with the memory unit; and an electrical connector carried by the support element and coupled with the device interface unit.

28. The invention of claim 27, wherein the three-dimensional memory array comprises a plurality of layers of memory cells stacked vertically above one another in a single chip.

29. The invention of claim 24 or 27 wherein the device interface unit implements an interrupt management function for a selected protocol.

30. A memory device comprising:

an integrated circuit substrate;

a first memory array above the integrated circuit substrate; and a second memory array fabricated on the integrated circuit substrate under the first memory array;

wherein the first and second memory arrays each comprise a respective plurality of memory cells, and wherein the memory cells of the first memory array are of a different type than the memory cells of the second memory array.

31. The invention of claim 30, wherein the memory cells of the first memory array are write-once, and wherein the memory cells of the second memory array are write-many.

* * * * *